United States Patent
Guenard et al.

(10) Patent No.: US 11,837,463 B2
(45) Date of Patent: Dec. 5, 2023

(54) METHOD FOR MANUFACTURING A SUBSTRATE

(71) Applicant: Soitec, Bernin (FR)

(72) Inventors: Pascal Guenard, Froges (FR); Marcel Broekaart, Theys (FR); Thierry Barge, Chevrieres (FR)

(73) Assignee: SOITEC, Bernin (FR)

( * ) Notice: Subject to any disclaimer, the term of this patent is extended or adjusted under 35 U.S.C. 154(b) by 387 days.

(21) Appl. No.: 17/095,550

(22) Filed: Nov. 11, 2020

(65) Prior Publication Data

US 2021/0066063 A1 Mar. 4, 2021

Related U.S. Application Data

(63) Continuation of application No. 15/743,004, filed as application No. PCT/EP2016/066609 on Jul. 13, 2016, now Pat. No. 10,943,778.

(30) Foreign Application Priority Data

Jul. 17, 2015 (FR) .................................. 1501519

(51) Int. Cl.
*H01L 21/02* (2006.01)
*H10N 30/50* (2023.01)
(Continued)

(52) U.S. Cl.
CPC .. *H01L 21/02002* (2013.01); *H01L 21/02367* (2013.01); *H01L 21/02436* (2013.01);
(Continued)

(58) Field of Classification Search
CPC ......... H01L 21/02002; H01L 21/02367; H01L 21/02436; H10N 30/072; H10N 30/50; H10N 30/8542; H03H 9/02574
See application file for complete search history.

(56) References Cited

U.S. PATENT DOCUMENTS 8,542,434 B2 9/2013 Kondo et al.
2002/0180316 A1 12/2002 Linden
(Continued)

FOREIGN PATENT DOCUMENTS

CN 1816897 A 8/2006
CN 102341900 A 2/2012
(Continued)

OTHER PUBLICATIONS

European Communication pursuant to Article 94(3) EPC for European Application No. 16/741,587, dated Dec. 17, 2020, 6 pages.
(Continued)

*Primary Examiner* — Ermias T Woldegeorgis
(74) *Attorney, Agent, or Firm* — TraskBritt

(57) ABSTRACT

A method for manufacturing a substrate includes the following steps: (a) providing a support substrate with a first coefficient of thermal expansion, having on one of its faces a first plurality of trenches parallel to each other in a first direction, and a second plurality of trenches parallel to each other in a second direction; (b) transferring a useful layer from a donor substrate to the support substrate, the useful layer having a second coefficient of thermal expansion; wherein an intermediate layer is inserted between the front face of the support substrate and the useful layer, the intermediate layer having a coefficient of thermal expansion between the first and second coefficients of thermal expansion.

20 Claims, 2 Drawing Sheets

(51) Int. Cl.
  *H10N 30/072* (2023.01)
  *H10N 30/853* (2023.01)
  *H03H 9/02* (2006.01)

(52) U.S. Cl.
  CPC .......... *H10N 30/072* (2023.02); *H10N 30/50* (2023.02); *H10N 30/8542* (2023.02); *H03H 9/02574* (2013.01)

(56) References Cited

U.S. PATENT DOCUMENTS

| | | | |
|---|---|---|---|
| 2004/0241902 | A1 | 12/2004 | Letertre et al. |
| 2005/0006740 | A1 | 1/2005 | Letertre et al. |
| 2005/0026394 | A1 | 2/2005 | Letertre et al. |
| 2009/0267083 | A1 | 10/2009 | Cui |
| 2012/0018855 | A1 | 1/2012 | Colnat |

FOREIGN PATENT DOCUMENTS

| | | | | |
|---|---|---|---|---|
| EP | 1801625 | A1 * | 6/2007 | ............ G02B 6/122 |
| FR | 2942911 | A1 | 9/2010 | |
| JP | 57-004133 | A | 1/1982 | |
| JP | 06-168860 | A | 6/1994 | |
| JP | 09-082585 | A | 3/1997 | |
| JP | 09-092895 | A | 4/1997 | |
| JP | 2001-127577 | A | 5/2001 | |
| JP | 2003-124767 | A | 4/2003 | |
| JP | 2007-503726 | A | 2/2007 | |
| JP | 2007-527108 | A | 9/2007 | |
| JP | 2008-301066 | A2 | 12/2008 | |
| JP | 2012-053277 | A | 3/2012 | |
| JP | 2012-519974 | A | 8/2012 | |
| KR | 10-2003-0059280 | A | 7/2003 | |
| WO | 2014/129979 | A1 | 8/2014 | |

OTHER PUBLICATIONS

Japanese Decision to Grant a Patent for Japanese Application No. 2017-567605, dated May 12, 2020, 5 pages with English Translation.

Japanese Decision to Grant for Japanese Application No. 2020-037232, dated Jan. 5, 2021, 5 pages (2 pages of English Translation and 3 pages of Original Document).

Korean Grant of Patent for Korean Application No. 10-2018-7001215, dated Nov. 19, 2019, 2 pages with English Translation.

Korean Notification of Reason for Refusal for Korean Application No. 10-2018-7001215, dated May 10, 2019, 13 pages with English Translation.

French Search Report for French Application No. 1501519 dated May 11, 2016, 7 pages.

Hashimoto et al., "Recent Development of Temperature Compensated SAW Devices", IEEE Ultrason. Symp. 2011, pp. 79-86, 2011.

International Search Report for International Application No. PCT/EP2016/066609, dated Sep. 16, 2017, 2 pages.

International Written Opinion for International Application No. PCT/EP2016/066609, dated Sep. 16, 2017, 6 pages.

Japanese Decision of Refusal for Japanese Application No. 2017-567605, dated Nov. 5, 2019, 10 pages with English Translation.

Japanese Notice of Reasons for Refusal for Japanese Application No. 2017-567605, dated Mar. 22, 2019, 12 pages with English Translation.

Japanese Office Action for Japanese Application No. dated Mar. 26, 2019, 6 pages.

Japanese Search Report for Japanese Application No. 2017-567605, dated Feb. 20, 2019, 18 pages with English Translation.

Japanese Written Opinion for Japanese Application No. 2017-567605, dated Jun. 20, 2019, 7 pages with English Translation.

Korean Notice of Preliminary Rejection for Korean Application No. 10-2018-7001215 dated May 10, 2019, 14 pages.

* cited by examiner

METHOD FOR MANUFACTURING A SUBSTRATE

CROSS-REFERENCE TO RELATED APPLICATIONS

This application is a continuation of U.S. patent application Ser. No. 15/743,004, filed Jan. 9, 2018, now U.S. Pat. No. 10,943,778 issued Feb. 17, 2021, which is a national phase entry under 35 U.S.C. § 371 of International Patent Application PCT/EP2016/066609, filed Jul. 13, 2016, designating the United States of America and published as International Patent Publication WO 2017/012940 A1 on Jan. 26, 2017, which claims the benefit under Article 8 of the Patent Cooperation Treaty to French Patent Application Serial No. 1501519, filed Jul. 17, 2015, the disclosure of each of which is hereby incorporated herein in its entirety by this reference.

TECHNICAL FIELD

The present disclosure relates to a method of manufacturing a substrate comprising a support substrate having a first coefficient of thermal expansion (CTE) and a useful layer having a second coefficient of thermal expansion different from the first coefficient of thermal expansion.

BACKGROUND

Referring to FIG. 1, the manufacture of acoustic surface wave filters (F-SAW) may comprise the formation of inter-digitated metal comb electrodes 5 on one side of a piezoelectric material, for example, lithium tantalate $LiTaO_3$.

The geometrical characteristics of the inter-digitated comb electrodes, such as the comb size, or their spacing, determine the resonant frequency and the quality factor of the SAW filters.

In this respect, a person skilled in the art can refer to the article "Recent development of temperature compensated SAW devices," Ken-ya Hashimoto et al., IEEE Ultrasonics Symposium (IUS), 2011 IEEE International, pp. 79-86.

In normal use, the filters may be subjected to temperatures in the range extending from −40° C. to 85° C.

However, piezoelectric materials such as lithium tantalate have a coefficient of thermal expansion on the order of 14 in at least one of the crystallographic directions.

Consequently, the temperature variations induce a variability of the geometric characteristics of the F-SAW filters.

To overcome this problem, it is possible to position a stiffener substrate on one side of the piezoelectric material.

FIG. 2 shows a structure comprising a silicon substrate 1, a layer of $LiTaO_3$ 3 formed on the silicon substrate 1, and interdigitated comb metal electrodes 5 on the free surface 4 of the $LiTaO_3$ layer 3.

The low coefficient of thermal expansion of silicon, the latter being equal to $2.6 \times 10^{-6}/°$ C., makes it possible to limit the expansion of the $LiTaO_3$ layer and consequently to limit the variations of the resonance frequency and the quality factor of the F-SAW filter. This effect is referred to hereinafter as "thermal compensation."

The method of manufacturing a substrate comprising a layer of $LiTaO_3$ on a silicon substrate involves the following manufacturing steps:

a. providing a support substrate 1, for example, of silicon; and b. the transfer of a layer of $LiTaO_3$ 3 on one of the faces of the support substrate 1, specifically the front face 1a.

The transfer of the $LiTaO_3$ layer is generally carried out by assembling a $LiTaO_3$ substrate with a silicon substrate, followed by a step of thinning, for example, mechanical thinning, of the $LiTaO_3$ substrate.

This method is, however, not satisfactory because it requires a strengthening of the bonded interface between the $LiTaO_3$ and the silicon by way of a heat treatment.

Indeed, the difference between the thermal expansion coefficients of $LiTaO_3$ and silicon causes a degradation of the bonding interface, namely a detachment and/or the appearance of cracks in the $LiTaO_3$ layer.

US Patent Publication No. 2009/0267083 A1 proposes to overcome the aforementioned drawbacks by providing a trench network on the rear face of the support substrate 1. The formation of the trenches makes it possible to limit the constraints at the bonding interface and, thus, ensures the integrity of the useful layer.

This solution is not satisfactory because it does not accommodate large differences in thermal expansion coefficient.

BRIEF SUMMARY

An object of the present disclosure is, therefore, to provide a method of manufacturing a substrate adapted to withstand heat treatment while retaining the thermal compensation effect.

The disclosure solves the technical problem and relates to a method of manufacturing a substrate comprising a useful layer placed on a receiving substrate, the method comprising the following steps:

a. Providing a support substrate with a first coefficient of thermal expansion, having on one of its faces, referred to as the front face, a first plurality of trenches parallel to each other in a first direction, and a second plurality of trenches parallel to each other in a second direction not parallel to the first direction; and b. Transferring a useful layer from the donor substrate to the support substrate, the useful layer having a second coefficient of thermal expansion different from the first coefficient of thermal expansion.

The method further includes insertion of an intermediate layer between the front face of the support substrate and the useful layer, the intermediate layer having a coefficient of thermal expansion between the first and second coefficients of thermal expansion.

Therefore, the presence of the first plurality of trenches and the second plurality of trenches allows one to break the constraint field exerted on the interface between the intermediate layer and the support substrate.

Furthermore, the presence of the intermediate layer enables limiting the effect of the difference between the first and second coefficients of thermal expansion, while maintaining a thermal compensation effect.

In addition, the presence of the intermediate layer enables having a space between the trenches of each of the pluralities of trenches greater than the dimension of an F-SAW intended to be formed on the substrate thus obtained.

According to one embodiment, step b. of transferring the useful layer comprises the assembly of the donor substrate with the support substrate, and the thinning of the donor substrate in order to form the useful layer.

According to one embodiment, the thinning of the donor substrate is carried out using mechanical thinning.

According to one embodiment, the intermediate layer is formed, before step b. of transferring the useful layer, onto the support substrate or onto the donor substrate.

According to one embodiment, the intermediate layer comprises a glass material.

According to one embodiment, the intermediate layer comprises at least one of the materials included in the group consisting of TEOS, BPSG, PSG, and USG.

According to one embodiment, the trenches of the first plurality of trenches are regularly arranged every 3 to 10 millimeters.

According to one embodiment, the trenches of the second plurality of trenches are regularly arranged every 3 to 10 millimeters.

According to one embodiment, the trenches of the first plurality of trenches and the second plurality of trenches have a depth between 1 and 100 μm.

According to one embodiment, the trenches of the first plurality of trenches and the second plurality of trenches have a width between 1 and 100 μm.

According to one embodiment, the useful layer comprises at least one of the materials included in the group consisting of $LiTaO_3$ and $LiNbO_3$.

According to one embodiment, the difference between the first coefficient of thermal expansion and the second coefficient of thermal expansion is greater than $5 \times 10^{-6}/°$ C., and preferably greater than $10 \times 10^{-6}/°$ C.

According to one embodiment, the useful layer comprises at least one of the materials included in the group consisting of silicon, germanium, silicon carbide, alumina, sapphire, or aluminum nitride.

Additional embodiments of the present invention include a substrate comprising:
  a. a support substrate with a first coefficient of thermal expansion, having on one of its faces, referred to as the front face, a first plurality of trenches parallel to each other in a first direction, and a second plurality of trenches parallel to each other in a second direction not parallel to the first direction; and
  b. a useful layer with a second coefficient of thermal expansion different from the first coefficient of thermal expansion and arranged on the support substrate.

The substrate further includes an intermediate layer inserted between the front face of the support substrate and the useful layer, the intermediate layer having a coefficient of thermal expansion between the first and second coefficients of thermal expansion.

BRIEF DESCRIPTION OF THE DRAWINGS

The invention will be better understood in light of the following description of specific and non-limiting example embodiments of the invention with reference to the accompanying figures (drawings) in which.

DETAILED DESCRIPTION

Figure 1:
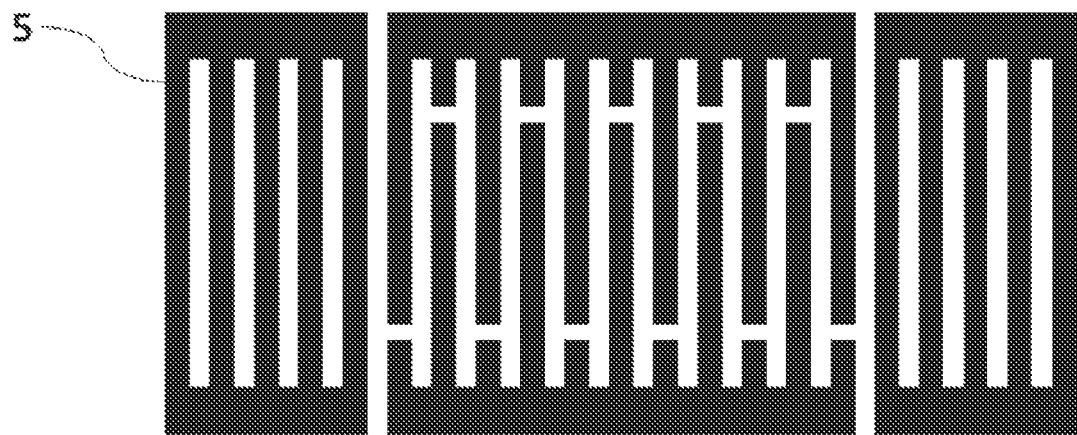
FIG. 1 illustrates interdigitated combs forming a filter with surface acoustic waves according to previously known methods.
Figure 2:
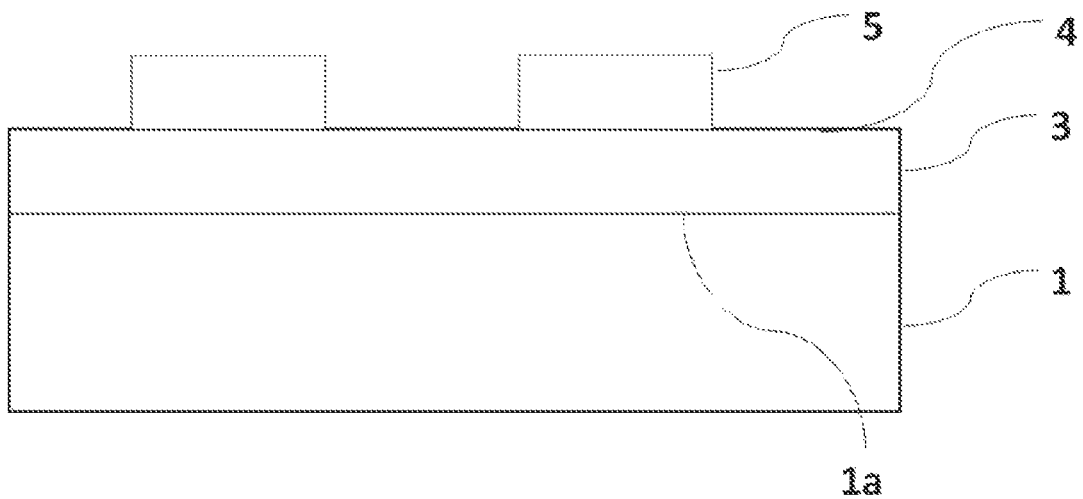
FIG. 2 illustrates a substrate used for producing a filter with surface acoustic waves according to previously known methods.
Figure 3:
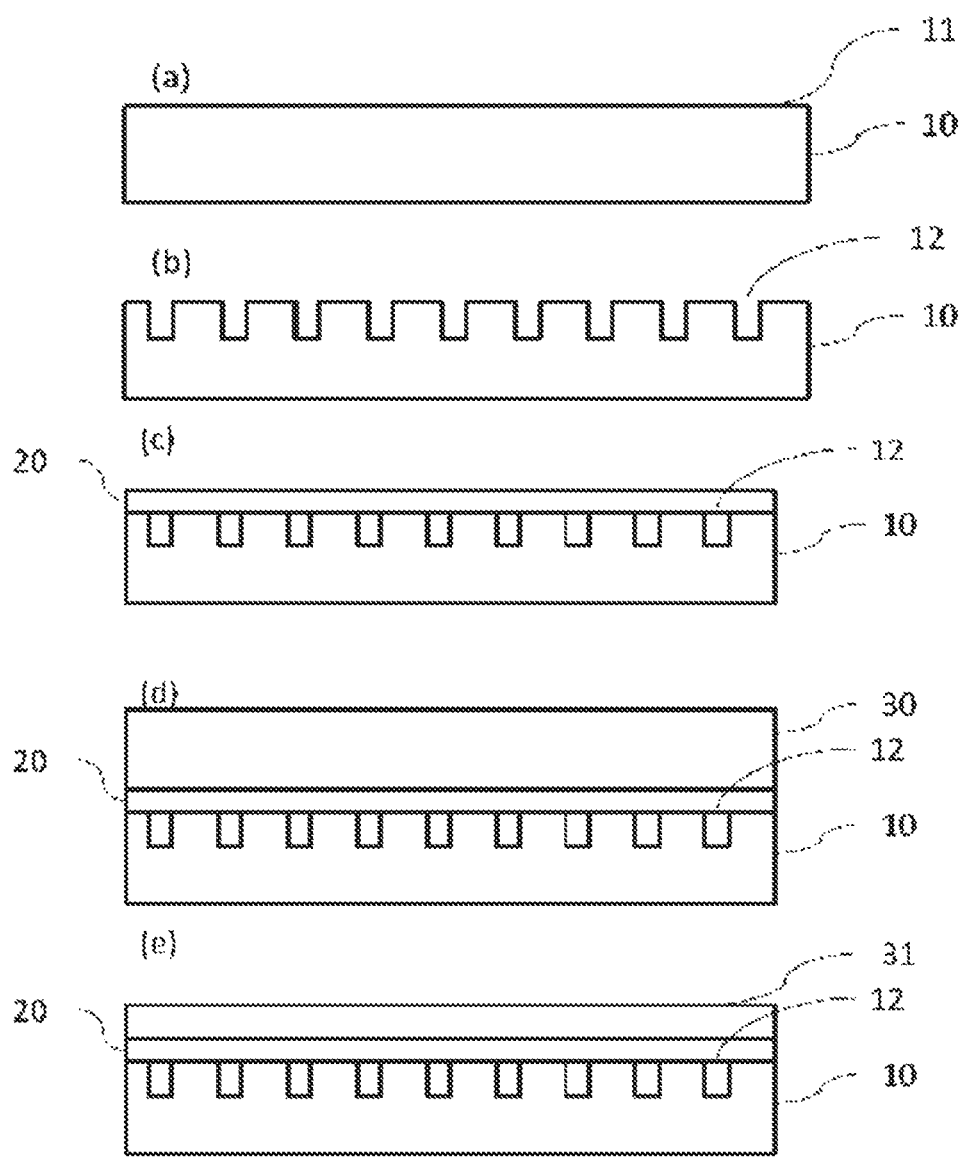
FIG. 3 is a schematic illustration of an embodiment of a method for manufacturing according to the present disclosure.

For the various embodiments, the same references will be used for identical elements or ensuring the same function, in the interests of simplification of the description.

The method according to the disclosure comprises a step a. of providing a support substrate 10 with a first coefficient of thermal expansion.

The support substrate 10 can comprise at least one of the materials chosen from the group consisting of silicon, germanium, silicon carbide, alumina, sapphire, and aluminum nitride.

The support substrate 10 exhibits a coefficient of thermal expansion between $2 \times 10^{-6}/°$ C. and $9 \times 10^{-6}/°$ C.

For example, a support substrate 10 comprising silicon exhibits a coefficient of thermal expansion of $2 \times 10^{-6}/°$ C.

The support substrate 10 also comprises on one of its faces, that is, the front face 11, a first plurality of trenches 12. The trenches of the first plurality of trenches 12 are parallel to each other in a first direction.

The support substrate 10 can also comprise, on its front face 11, a second plurality of trenches 13. The trenches of the second plurality of trenches 13 are parallel to each other in a second direction. The second direction is not parallel to the first direction.

The trenches of the first plurality of trenches 12 can be regularly arranged every 3 to 10 millimeters.

The trenches of the second plurality of trenches 13 can be regularly arranged every 3 to 10 millimeters.

The trenches of the first plurality of trenches 12 can have a depth between 1 and 100 μm.

The trenches of the second plurality of trenches 13 can have a depth between 1 and 100 μm.

The trenches of the first plurality of trenches 12 and the second plurality of trenches 13 can have a width between 1 and 100 μm.

The trenches of the first plurality of trenches 12 and of the second plurality of trenches 13 can be formed by a sawing wheel of the type generally used in the microelectronic industry. The sawing techniques using such a sawing wheel are well known in the art.

The width of the trenches of the first plurality of trenches 12 and the second plurality of trenches 13 is defined by the thickness of the sawing wheel.

In addition, the depth of the trenches is also defined by the sawing depth.

The trenches of the first and second pluralities of trenches can also be achieved by the formation of an etching mask on the front face 11 of the support substrate 10. The aforementioned etching mask designs the shape of the trenches of the first plurality of trenches 12 and the second plurality of trenches 13, on the front face 11 of the support substrate 10.

The etching forming the trenches is, therefore, executed by using a suitable etching.

For example, in embodiments in which the support substrate 10 is a silicon substrate, the etching mask may comprise silicon dioxide, and the etching may be carried out using a KOH solution.

After the forming of the trenches of the first plurality of trenches 12 and of the second plurality of trenches 13, an intermediate layer 20 is formed on the front face 11 of the support substrate 10.

The intermediate layer 20 can conformally cover the front face 11 of the support substrate 10 by conforming to the shape of the trenches.

The intermediate layer 20 can have a thickness comprised between 0.5 and 50 μm.

Advantageously, the intermediate layer 20 can deform itself plastically when it is subjected to a thermal treatment with a rise in temperature.

Advantageously, the intermediate layer 20 can comprise a glass material.

For example, the intermediate layer 20 can comprise at least one of the materials included in the group consisting of borophosphosilicate glass (BPSG), tetraethyl orthosilicate oxide (TEOS oxide), phosphosilicate glass (PSG), and undoped silicate (USG).

The method according to the disclosure also comprises a step b., which comprises the forming of a useful layer 31 on the intermediate layer 20.

The useful layer 31 can be formed by a method of layer transfer from a donor substrate 30.

The transfer step can comprise the assembly of a donor substrate 30 with the intermediate layer 20.

The assembly step can be a step of bonding by molecular adhesion.

A step of thermal treatment can be carried out so as to reinforce the bonding interface.

For example, a thermal treatment can be carried out at a temperature between 80° C. and 150° C., preferably between 100° C. and 120° C., for a period of time between 30 minutes and 4 hours, under a non-oxidizing atmosphere, for example, under nitrogen and/or argon and/or helium.

In order to reinforce the bonding interface, the donor substrate 30 surface intended to be put into contact with the intermediate layer 20 can be activated with plasma.

For example, the activation can be carried out with a dioxygen plasma ($O_2$) or with dinitrogen ($N_2$), for 30 seconds, at a power output of 500 Watts, and a pressure of 50 mTorr.

The assembly step is, therefore, followed by a thinning of the donor substrate 30. Therefore, the thinned donor substrate 30 forms the useful layer 31.

The thinning of the donor substrate 30 can be executed by using techniques well known in the art, such as mechanical thinning, and/or by mechanical-chemical polishing.

The useful layer 31 can, therefore, following the thinning step of the donor substrate 30, have a thickness between 5 and 50 µm.

According to a variant of the method of manufacturing according to the disclosure, the intermediate layer 20 can be formed on the donor substrate 30. In these conditions, the assembly step comprises putting in contact the intermediate layer 20 with the front face 11 of the support substrate 10.

The useful layer 31 has a second coefficient of thermal expansion different from the first coefficient of thermal expansion.

The useful layer 31 can comprise a perovskite-type material.

The useful layer 31 can comprise a dielectric material, the material preferably being a ferroelectric material.

The useful layer 31 can comprise at least one of the materials included in the group consisting of $LiTaO_3$ and $LiNbO_3$.

According to the disclosure, the intermediate layer 20 has a coefficient of thermal expansion between the first coefficient of thermal expansion and the second coefficient of thermal expansion.

The difference between the first coefficient of thermal expansion and the second coefficient of thermal expansion may be greater than $5 \times 10^{-6}/°$ C. and, preferably, greater than $10 \times 10^{-6}/°$ C.

For such differences in thermal expansion coefficients, the method according to the disclosure enables ensuring the integrity of the package comprising the support substrate 10, the intermediate layer 20 and the useful layer 31 at the time of thermal annealing.

In this way, the presence of the intermediate layer 20 enables limiting the effect of the difference between the first coefficient of thermal expansion and the second coefficient of thermal expansion, while maintaining a thermal compensation effect.

In addition, the presence of at least the first plurality of trenches 12 on the front face 11 of the support substrate 10 enables disrupting the continuity of the constraints present at the interface formed by the intermediate layer 20 and the front face 11.

Therefore, taken in combination, the effect of the intermediate layer 20 and the presence of at least the first plurality of trenches 12 enables limiting the constraints exerted on the interfaces formed on the one hand, by the useful layer 31 and the intermediate layer 20, and on the other hand, by the intermediate layer 20 and the support substrate 10.

First Embodiment

According to a first embodiment, the disclosure comprises the provision of a silicon support substrate 10.

The first plurality of trenches 12 are formed with a sawing wheel. The trenches of the first plurality of trenches 12 are spaced from each other by 3 mm, have a depth of 100 µm, and a width of 100 µm.

The intermediate layer 20, which is formed directly on the front face 11 of the support substrate 10, comprises borophosphosilicate glass, and its thickness is between 0.5 and 50 µm, for example, 2 µm.

The intermediate layer 20 conforms to the topography of the front face 11 of the support substrate 10.

Still according to the first embodiment, a donor substrate 30 of $LiTaO_3$ is provided.

The surface of the donor substrate 30 intended to be placed in contact with the intermediate layer 20 is activated by plasma comprising dioxygen.

The surface of the activated donor substrate 30 is, therefore, assembled with the intermediate layer 20 by molecular adhesion.

The assembly interface formed by the donor substrate 30 and the intermediate layer 20 is reinforced by a thermal annealing carried out at 100° C. for a period of 3 hours under an argon atmosphere.

The donor substrate 30 is then thinned mechanically to a thickness of 20 µm, in order to form the useful layer 31.

Second Embodiment

The second embodiment differs from the first embodiment in that the intermediate layer 20 is formed on the donor substrate 30 rather than on the front face 11 of the support substrate 10 and in that the plasma activation is achieved on the front face 11 of the support substrate 10.

What is claimed is:

1. A method for manufacturing a substrate comprising a useful layer on a receiving substrate, the method comprising:

providing a support substrate having a first coefficient of thermal expansion;

providing a donor substrate comprising at least one material selected from the group consisting of $LiTaO_3$ and $LiNbO_3$, the at least one material having a second coefficient of thermal expansion different from the first coefficient of thermal expansion;

providing an intermediate layer on a surface of at least one of the support substrate and the donor substrate, the intermediate layer having a coefficient of thermal expansion between the first coefficient of thermal expansion and the second coefficient of thermal expansion;

assembling the donor substrate with the support substrate with the intermediate layer disposed between the donor substrate and the support substrate; and transferring a useful layer of the at least one material from the donor substrate onto the support substrate, the intermediate layer disposed between the useful layer and the support substrate.

2. The method of claim 1, wherein transferring the useful layer comprises thinning the donor substrate to form the useful layer.

3. The method of claim 2, wherein thinning the donor substrate comprises mechanical thinning the donor substrate.

4. The method of claim 3, further comprising providing the intermediate layer on the surface of the at least one of the support substrate and the donor substrate before transferring the useful layer from the donor substrate onto the support substrate.

5. The method of claim 1, wherein the support substrate comprises, on a front face thereof:
a first plurality of trenches parallel to each other in a first direction; and
a second plurality of trenches parallel to each other in a second direction not parallel to the first direction.

6. The method of claim 5, wherein the trenches of the first plurality of trenches are separated from one another by an average distance of from 3 millimeters to 10 millimeters.

7. The method of claim 6, wherein the trenches of the second plurality of trenches are separated from one another by an average distance of from 3 millimeters to 10 millimeters.

8. The method of claim 5, wherein the trenches of the first plurality of trenches and the second plurality of trenches have an average depth between 1 μm and 100 μm.

9. The method of claim 8, wherein the trenches of the first plurality of trenches and the second plurality of trenches have an average width between 1 μm and 100 μm.

10. The method of claim 1, wherein providing an intermediate layer on a surface of at least one of the support substrate and the donor substrate comprises depositing a glass on the surface of at least one of the support substrate and the donor substrate.

11. The method of claim 10, wherein the glass comprises at least one material selected from the group consisting of TEOS, BPSG, PSG, or USG.

12. The method of claim 1, wherein the difference between the first coefficient of thermal expansion and the second coefficient of thermal expansion is greater than 5×10-6/° C.

13. The method of claim 12, wherein the difference between the first coefficient of thermal expansion and the second coefficient of thermal expansion is greater than 10×10-6/° C.

14. The method of claim 1, wherein the support substrate comprises at least one material selected from the group consisting of silicon, germanium, silicon carbide, alumina, sapphire, and aluminum nitride.

15. A substrate, comprising:
a support substrate having a first coefficient of thermal expansion, the support substrate including, on a front face thereof:
a first plurality of trenches parallel to each other in a first direction; and
a second plurality of trenches parallel to each other in a second direction not parallel to the first direction;
a useful layer having a second coefficient of thermal expansion different from the first coefficient of thermal expansion, the useful layer comprising at least one material selected from the group consisting of LiTaO$_3$ and LiNbO$_3$; and
an intermediate layer disposed between the support substrate and the useful layer, the intermediate layer having a coefficient of thermal expansion between the first coefficient of thermal expansion and the second coefficient of thermal expansion.

16. The substrate of claim 15, wherein the intermediate layer comprises a glass.

17. The substrate of claim 16, wherein the glass comprises at least one material selected from the group consisting of TEOS, BPSG, PSG, or USG.

18. The substrate of claim 15, wherein a difference between the first coefficient of thermal expansion and the second coefficient of thermal expansion is greater than 5×10-6/° C.

19. The substrate of claim 15, wherein the support substrate comprises at least one material selected from the group consisting of silicon, germanium, silicon carbide, alumina, sapphire, and aluminum nitride.

20. A surface acoustic wave (SAW) device, comprising:
a substrate, including:
a support substrate having a first coefficient of thermal expansion, the support substrate including, on a front face thereof:
a first plurality of trenches parallel to each other in a first direction; and
a second plurality of trenches parallel to each other in a second direction not parallel to the first direction;
a useful layer having a second coefficient of thermal expansion different from the first coefficient of thermal expansion, the useful layer comprising at least one material selected from the group consisting of LiTaO$_3$ and LiNbO$_3$; and
an intermediate layer disposed between the support substrate and the useful layer, the intermediate layer having a coefficient of thermal expansion between the first coefficient of thermal expansion and the second coefficient of thermal expansion; and
electrodes on or in the useful layer of the substrate.

* * * * *